United States Patent [19]
Sugizaki

[11] 3,973,207
[45] Aug. 3, 1976

[54] ELECTRONIC CHANNEL SELECTOR INCLUDING CONTROL MEANS FOR SELECTING A CHANNEL AND APPLYING POWER TO A LOAD CIRCUIT

[75] Inventor: Toshio Sugizaki, Fujisawa, Japan

[73] Assignee: Matsushita Electric Industrial Co., Ltd., Osaka, Japan

[22] Filed: Mar. 11, 1975

[21] Appl. No.: 557,417

[52] U.S. Cl. .............................. 325/457; 325/464; 325/492
[51] Int. Cl.² .......................................... H04B 1/26
[58] Field of Search ........... 325/389, 417, 451, 453, 325/457, 459, 464, 465, 492, 390, 392

[56] References Cited
UNITED STATES PATENTS

| | | | |
|---|---|---|---|
| 2,186,823 | 1/1940 | De Tar | 325/457 |
| 3,602,822 | 8/1971 | Evans et al. | 325/464 |
| 3,757,260 | 9/1973 | Fujita | 325/465 |
| 3,889,195 | 6/1975 | Elshuber | 325/464 |

*Primary Examiner*—George H. Libman
*Attorney, Agent, or Firm*—Stevens, Davis, Miller & Mosher

[57] ABSTRACT

The present invention relates to a channel selector for a radio receiver, television receiver or the like having an electronic tuner including varactor diodes, which comprises a touch switching circuit, an oscillation circuit, a counter circuit and a decoder wherein an output of said decoder is coupled to a tuning voltage generating circuit and one of the outputs of the decoder is coupled to a power on-off switching circuit so that the channel selection and the turning on and off of the power supply can be attained by a single touch operation.

8 Claims, 5 Drawing Figures

ELECTRONIC CHANNEL SELECTOR INCLUDING CONTROL MEANS FOR SELECTING A CHANNEL AND APPLYING POWER TO A LOAD CIRCUIT

The present invention relates to a channel selector for a radio receiver, television receiver and the like having an electronic tuner.

In conventional television receivers, the selection of a channel requires turning on a power source and the switching of a channel selection switch. Thus, the operation is troublesome. Further, the reliability of the device is not satisfactory because mechanical contacts are used in the channel selection switches.

This invention is for solving the problems in the prior art.

It is therefore, an object of the present invention to allow fully electronic switching of the tuning voltage and fully electronic on-off control of a power supply in a channel selector for a receiver having an electronic tuner.

It is a second object of the present invention to enable the channel selection and the turning on and off of the power supply by a single touch operation.

It is a third object of the present invention to provide a channel selector which reliably operates with an A.C. power supply as well as with a battery.

The above and other objects, features and advantages of the present invention will become more apparent from the following detailed description of the preferred embodiments of the present invention referring to the accompanying drawings, in which.

Figure 2:
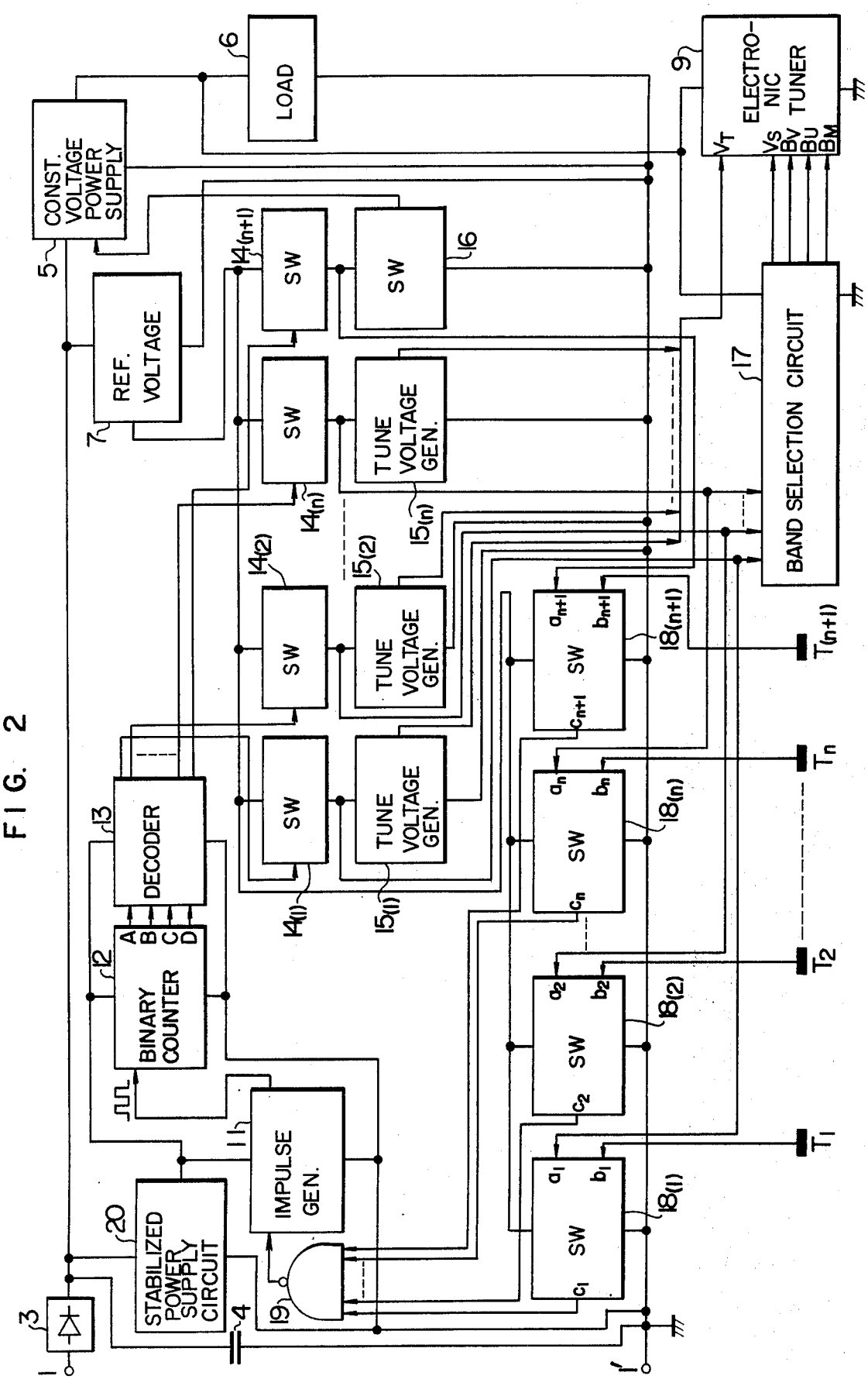
FIG. 2 shows a circuit diagram of a channel selector in one embodiment in accordance with the present invention.
Figure 3:
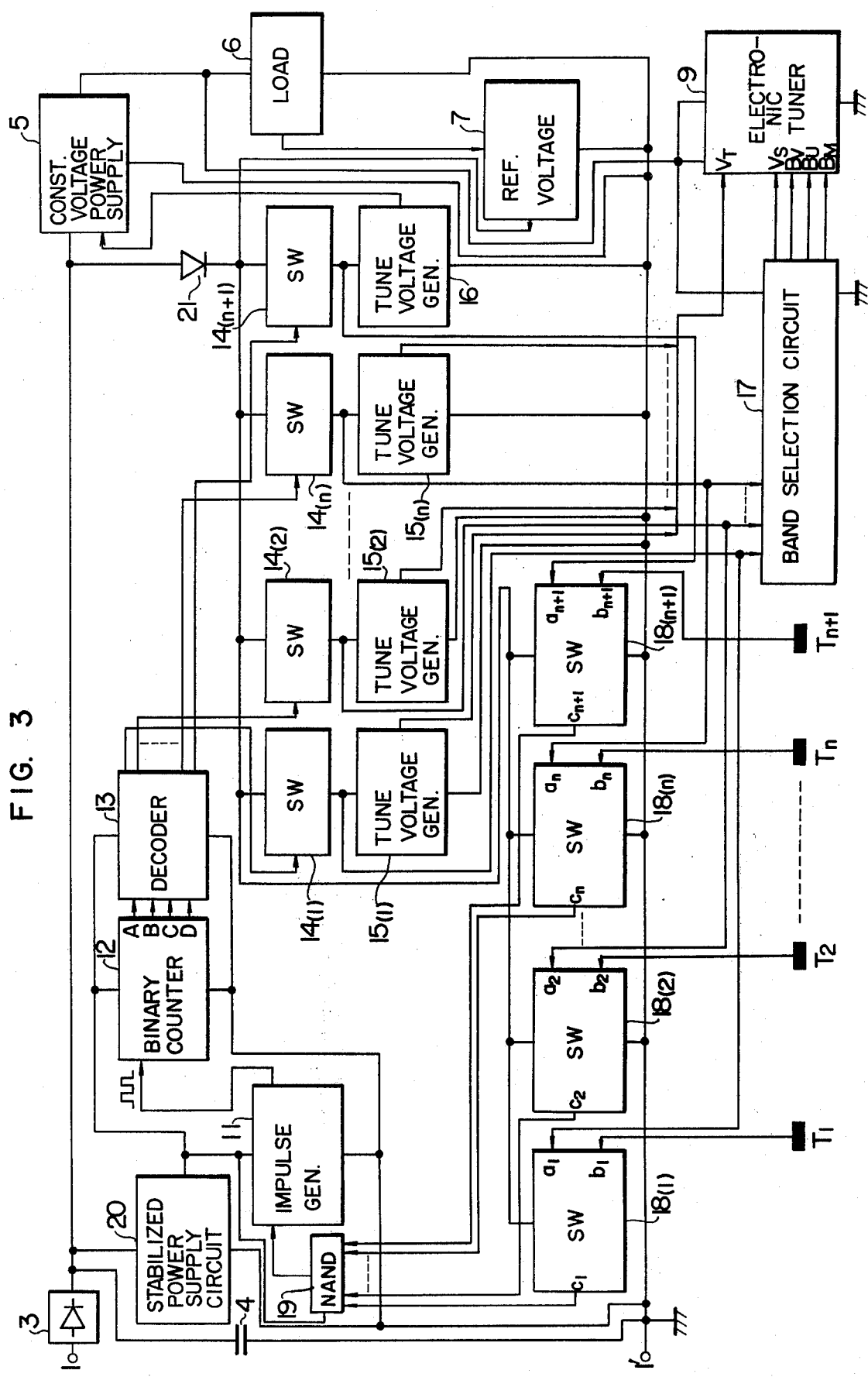
FIG. 3 shows a circuit diagram of a channel selector in another embodiment in accordance with the present invention.
Figure 5:
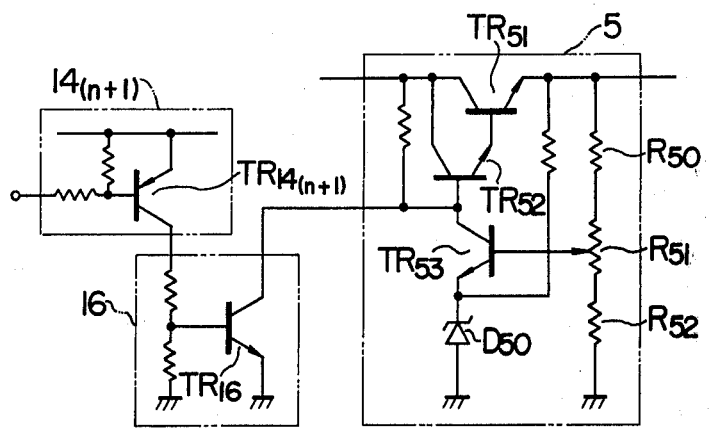

FIG. 5 shows a specific wiring diagram of the switching circuit 14 ($n + 1$), the switching circuit 16 and the constant voltage power supply circuit 5 shown in FIGS. 2 and 3.

Figure 1:
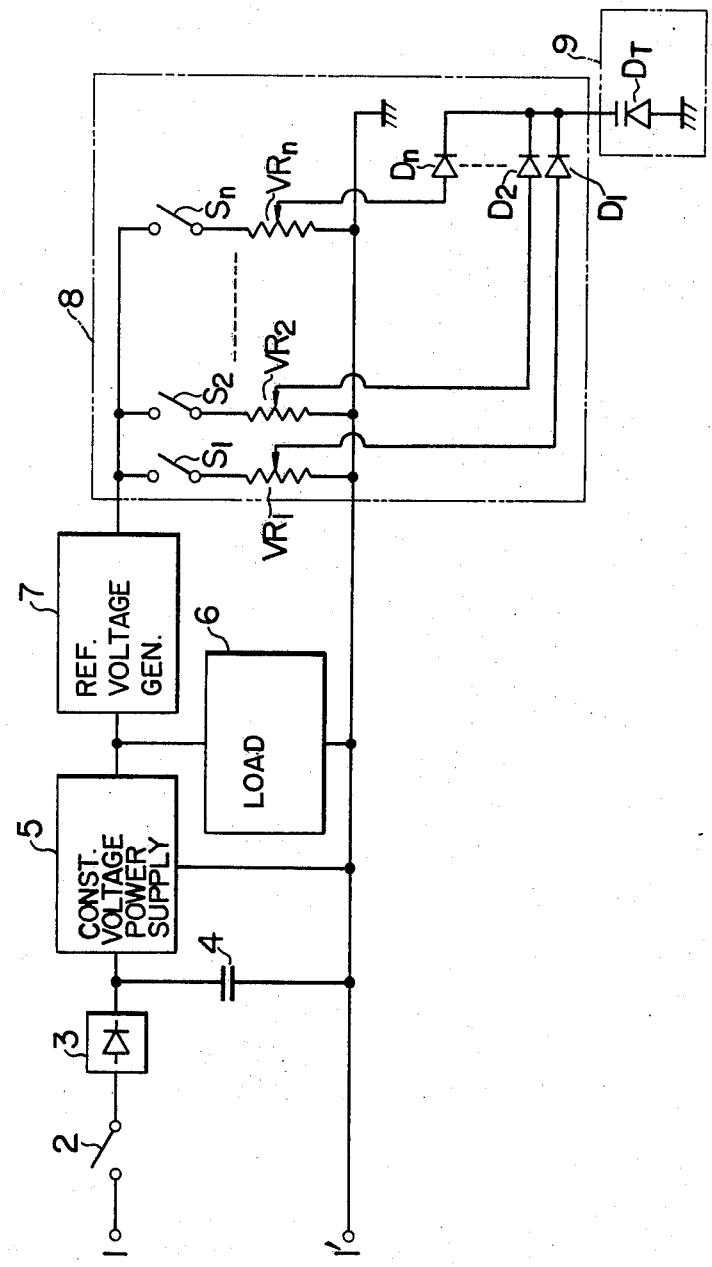
FIG. 1 shows a circuit diagram of a prior art channel selector.

Referring now to FIG. 1 which shows a construction of a television receiver having an electronic tuner having been commonly used in the prior art, the reference numerals 1 and 1' designate A.C. power supply input terminals, 2 a power switch, 3 a rectifier circuit, 4 a filtering capacitor and 5 a ripple filter circuit which may be a constant voltage power supply circuit. 6 designates a circuit, 7 a reference voltage generating circuit for generating a reference voltage to produce a tuning voltage and 8 a tuning voltage switching circuit, 9 an electronic tuner including a plurality of varactor diodes $D_T$. The load circuit 6 comprises, for example in a television receiver, the video, sound, vertical deflection and horizontal deflection circuits.

The tuning voltage switching circuit 8 includes switches $S_1, S_2, \ldots S_n$, presetting potentiometers $VR_1, VR_2, \ldots VR_n$ and diodes $D_1, D_2, \ldots D_n$ so that it allows the presetting of n channels.

The potentiometers $VR_1, VR_2, \ldots VR_n$ are preset so that predetermined tuning voltages are derived therefrom. When any one of the switches $S_1, S_2, \ldots S_n$ is closed the output voltage from the reference voltage generating circuit 7 is applied to the corresponding potentiometer so that the tuning voltage is supplied to the electronic tuner 9 through the corresponding diode. The switches $S_1, S_2, \ldots S_n$ are arranged such that when one of them is closed all of the remaining switches are opened. The diodes $D_1, D_2, \ldots D_n$ prevent backward flow of the current through the potentiometers $VR_1, VR_2, \ldots VR_n$ whose corresponding switches $S_1, S_2, \ldots S_n$ are opened.

With the above arrangement, in selecting a channel, two operations are required, that is, the power switch 2 should be first closed and one of the channel selection switches $S_1, S_2, \ldots S_n$ should be closed. In addition, satisfactory reliability is not assured since mechanical contacts are used in the apparatus.

Referring now to FIG. 2 illustrating an embodiment in accordance with the present invention, the reference numerals 1 and 1' designate A.C. power supply input terminals, 3 a rectifier circuit, 4 a filtering capacitor, 5 a constant voltage power supply circuit, 6 a load circuit, 7 a reference voltage generating circuit, 9 an electronic tuner and 11 an impulse generator. An output terminal of the impulse generator is connected to an input terminal of a binary counter 12, which, in turn, counts the impulses from the impulse generator 11 and supplies a set of outputs corresponding to the number of the input pulses from the output terminals A, B, C and D to a decoder 13. The binary counter 12 consists of a plurality of flip-flop circuits and the output therefrom is taken out in the form of BCD code. One of the output terminals of the decoder 13 is turned on depending on the particular set of the BCD code. The combination of the impulse generator 11, binary counter 12 and decoder 13 comprise a decoding means.

The reference numerals $14(1), 14(2), \ldots 14(n)$, $14(n + 1)$ designate switching circuits each arranged correspondingly to the outputs of the decoder 13 and turned on when the corresponding output of the decoder 13 is turned on. The numerals $15(1), 15(2), \ldots 15(n)$ designate tuning voltage generating circuits, and 16 designates a switching circuit for on-off controlling the constant voltage power supply circuit 5. Taken together, switching circuits $14(n+1)$ and 16 are designated the power switching means. When any one of the switching circuits $14(1), \ldots 14(n), 14(n + 1)$ is turned on, one of the tuning voltage generating circuits $15(1), 15(2), \ldots 15(n)$ and the switching circuit 16 corresponding to the turned-on output of the switching circuits $14(1), \ldots 14(n), 14(n + 1)$ is connected to the reference voltage of the reference voltage generating circuit 7 to produce a selected tuning voltage $V_T$ or to turn off the constant voltage power supply circuit 5. The outputs of the switching circuits $14(1), 14(2), \ldots 14(n)$ are also supplied to a band selection circuit 17 whereby the band selection circuit 17 supplies to the electronic tuner 9 and band selection voltage $V_s$ and a B voltage required by the respective bands so that the electronic tuner may be tuned to the bands corresponding to preselected channels, such as VHF LOW, VHF HIGH and UHF in the case of a television receiver.

The reference numerals $18(1), 18(2), \ldots 18(n)$, $18(n + 1)$ designate channel selection switching circuits each having two input terminals a and b and an output terminal c constructed to satisfy the relation $$c = a + \overline{b}$$

The truth table therefor is shown in Table I.

Table 1

| a | b | c |
|---|---|---|
| 0 | 1 | 0 |
| 1 | 1 | 1 |
| 1 | 0 | 1 |
| 0 | 0 | 1 |

One input terminal a of each of the channel selection switching circuit 18(1), 18(2), . . . . 18($n + 1$) is connected to the output terminal of a corresponding one of the switching circuits 14(1), 14(2), . . . . 14($n + 1$) while the other input terminal b is connected to a corresponding one of switching devices or channel selection touch plates $T_1$, $T_2$, . . . . $T_n$, $T_{n+1}$. Assuming that the input terminal a is 1 when the corresponding one of the switching circuits 14(1), 14(2) . . . . 14($n + 1$) is on and 0 when the latter is off, and the input terminal b is 1 when the corresponding touch plates $T_1$, $T_2$, . . . . $T_{n+1}$ is touched and 0 when the latter is not touched, the output of each of the channel selection switching circuits 18(1), 18(2), . . . . 18($n + 1$) is 0 only when the corresponding one of the touch plates $T_1$, $T_2$, . . . . $T_{n+1}$ is touched and the corresponding switching circuit in 14(1), 14(2), . . . . 14($n + 1$) is off.

The reference numeral 19 designates a multiinput NAND gate, the inputs thereof are connected with output terminals $C_1$, $C_2$, . . . . $C_{n+1}$ of the channel selection switching circuits 18(1), 18(2), . . . . 18($n + 1$). The output of the NAND gate 19 is connected to a control terminal of the impulse generator 11. The NAND gate 19 produces 1 output when at least one of the inputs thereto is 0.

The impulse generator 11 oscillates when the input to its control terminal is 1 and stops oscillating when the input is 0. 20 designates a stabilized power supply for the impulse generator 11, the binary counter 12, the decoder 13 and the NAND gate 19. It may be unnecessary depending on the circuit configuration selected.

The operation of the arrangement described above will now be explained. The A.C. power supply is rectified and filtered so that power is supplied from the output of the stabilized power supply 20 to the impulse generator 11, the binary counter 12, the decoder 13 and the NAND gate 19. On the other hand, one of the switching circuits 14($n + 1$) is supplied with power through the reference voltage generating circuit 7 so that it is in its on state. Other switching circuits 14(1), 14(2), . . . . 14($n$) are in the off state. The switching circuit 16 functions to on-off control the constant voltage power supply circuit 5 and the circuit 16 is constituted to turn off the constant voltage power supply circuit 5 when the switching circuit 14($n+1$) is on, and to turn on the constant voltage power supply circuit 5 when the switching circuit 14($n+1$) is off. Therefore, when the switching circuit 14($n + 1$) is on, the constant voltage power supply circuit 5 is turned off so that no power is supplied to the load 6 and the set is in its off state.

If one of the touch plates $T_1$, $T_2$, . . . . $T_{n+1}$, say the touch plate $T_1$ is touched, the output terminal $C_1$ of the channel selection switching circuit 18(1) produces 0 output because the switching circuit 14(1) is off. Thus, the NAND gate 19 produces 1 output to cause the oscillation of the impulse generator 11.

As a result, the switching circuit 14(1) corresponding to the touch plate $T_1$ is turned on through the binary counter 12 and the decoder 13. Upon turning on of the switching circuit 14(1), the output of the NAND gate 19 is rendered 0 in accordance with the above truth table so that the impulse generator 11 stops oscillating accordingly. The output terminal of the decoder 13 corresponding to the switching circuit 14(1) is maintained in the on state. As a result, the output of the tuning voltage generating circuit 15(1) is connected to the reference voltage so that a predetermined tuning voltage $V_T$ is applied to the electronic tuner 9. At the same time, the output of the switching circuit 14(1) is applied to the band selection circuit 17 to cause the electronic tuner 9 to be fixed to a desired channel. On the other hand, the switching circuit 14($n + 1$) is turned off, and the constant voltage power supply circuit 5 is turned on through the switching circuit 16 so that the load 6 is energized.

Figure 4:
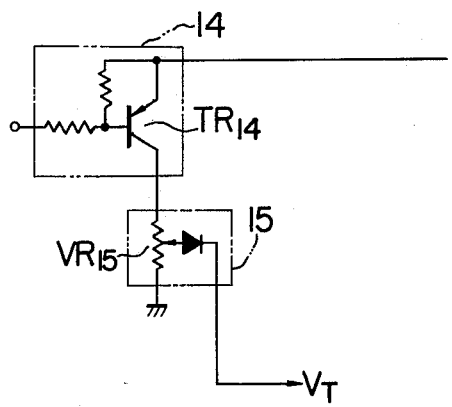
FIG. 4 shows a specific wiring diagram of a switching circuit and a tuning voltage generating circuit shown in FIGS. 2 and 3.

FIG. 4 shows a particular wiring diagram of the switching circuits 14(1), 14(2), . . . . 14($n$) and the tuning voltage generating circuits 15(1), 15(2), . . . . 15($n$). In FIG. 4, the switching circuit is represented as 14 and the tuning voltage generating circuit is represented as 15. TR 14 designates a transistor constituting the switching circuit 14, the base of the transistor TR14 being connected to the output terminal of the decoder 13. VR 15 designates a potentiometer constituting the tuning voltage generating circuit 15. With the above arrangement, the transistor TR 14 is turned on when the output of the decoder 13, which is connected to the base input of the transistor TR14, is 0 to connect the potentiometer VR 15 to the reference potential.

By touching one of the touch plates $T_2$, $T_3$, . . . . $T_n$, the corresponding channels may be similarly selected.

When the touch plate $T_{n+1}$ is touched, the switching circuits 14(1), 14(2), . . . . 14($n$) are turned off and the switching circuit 14($n + 1$) is turned on. The turn-on of the switching circuit 14($n + 1$) causes the switching circuit 16 to turn off the constant voltage power supply circuit 5. Thus, the load 6 is deenergized to be reset to its initial state.

FIG. 5 shows a particular wiring diagram of the switching circuit 14($n + 1$), the switching circuit 16 and the constant voltage power supply circuit 5. In FIG. 5, TR 14($n$+1) designates a transistor constituting the switching circuit 14($n$+1), TR 16 designates a transistor constituting the switching circuit 16, TR 51 a series regulating transistor, TR 52 a transistor for controlling the series regulating transistor TR 51, TR 53 an error detecting transistor, D 50 a zener diode, and R 50, R 51 and R 52 designate voltage variation detecting resistors.

With the above arrangement, when the output of the decoder 13, which is connected to the base input of the transistor TR 14($n$+1), is 0 the transistor TR 14($n$+1) is turned on to render the transistor TR 16 conductive. As a result, the base potential of the transistor TR 52 is rendered zero. Thus, the transistors TR 52 and TR 51 are cut off and the output of the constant voltage power supply circuit 5 is rendered zero.

The impulse generator 11, the binary counter 12, the decoder 13, the switching circuits 14(1), 14(2), . . . . 14($n + 1$), the channel selection switching circuit 18(1), 18(2), . . . . 18($n + 1$) and the NAND gate 19 must be supplied with power supply voltage even during the off state of the receiver set in order to assure operating of the channel selection and turning off of the switching circuit 14(n + 1) when the touch members $T_1, T_2, \ldots T_n$ are touched. To this end, in FIG. 2, the stabilized power supply circuit 20 is inserted at the input terminal side of the constant voltage power supply circuit 5. The power to the switching circuits 14(1), 14(2), . . . . 14(n + 1) and the channel selection switching circuits 18(1), 18(2), . . . . 18(n + 1) is supplied, similarly to the stabilized power supply circuit 20, from the input terminal side of the constant voltage power supply through the reference voltage generating circuit 7. Therefore, even during the off state of the receiver set, the impulse generator 11, the binary counter 12, the decoder 13, the switching circuits 14(1), 14(2), . . . . 14(n + 1), the channel selection switching circuits 18(1), 18(2), . . . . 18(n + 1) and the NAND gate 19 are supplied with power supply voltage.

With the arrangement shown in FIG. 2, by the use of the binary counter 12 and the decoder 13 the circuit can be constructed for the selection of n channels to be selected with less than n number of storage elements. For example, when the number n of channels to be selected is 15, the flip-flop circuits required in the counter 12 may be 4.

By making one of the outputs of the decoder 13 associated with the switching circuit 16 having the power on-off function, it has become possible to turn on the receiver set simultaneously with the channel selection be merely touching any of the touch plates.

Furthermore, the memory function of a particular channel during the off state of the receiver set, which has been readily attained in a prior art mechanical channel selection switch, can also be attained equivalently in the present embodiment. Namely, when it is desired to memorize the No. 1 channel during the off state of the receiver set, it is sufficient to touch the touch plate corresponding to the No. 1 channel.

By supplying the rectified output voltage to the impulse generator, the counter, the decoder, etc., as the power supply thereto, any desired channel can be immediately selected from the off state of the receiver set.

Further, reliability is enhanced since the entire system is constructed in full electronic fashion without mechanical switches.

FIG. 3 shows another embodiment of the present invention. In this embodiment, during the off state of the receiver set the power to the switching circuits 14(1), 14(2), . . . . 14(n + 1), the tuning voltage generating circuits 15(1), 15(2), . . . . 15(n) and the channel selection switching circuits 18(1), 18(2), . . . . 18(n + 1) is supplied through a diode 21 inserted in the input terminal side of the constant voltage power supply circuit 5. On the other hand, during the on state of the receiver set, the power to the switching circuits 14(1), 14(2), . . . . 14(n + 1), the tuning voltage generating circuits 15(1), 15(2), . . . . 15(n) and the channel selection switching circuits 18(1), 18(2), . . . . 18(n + 1) is supplied by rectifying the pulses produced across the load 6 in the constant voltage power supply circuit 5.

A reference voltage of about 30 volts is usually required as a tuning voltage. When the output voltage of the rectifier circuit 3 is 30 volts or higher, the reference voltage generating circuit 7 may be inserted in the input terminal side of the constant voltage power supply circuit 5. On the other hand, when the output voltage of the rectifier circuit is lower than 30 volts, the power to the reference voltage generating circuit 7 is supplied by rectifying the pulses from the load 6, and during the on state of the receiver set power to the switching circuits 14(1), 14(2), . . . . 14(n + 1) and the tuning voltage generating circuits 15(1), 15(2), . . . . 15(n) are supplied through the reference voltage generating circuit 7. During the on state of the receiver set the diode 21 is reverse biased so that it is in the off state.

Although the stabilized power supply circuit and the reference voltage generating circuit 7 are formed into two blocks in FIG. 2, they may be constructed in one circuit as required.

With the arrangement shown in FIG. 3, the same effects as those in FIG. 2 may be attained. Furthermore, with the arrangement of FIG. 3, the power to the switching circuits 14(1), 14(2), . . . . 14(n + 1) and the tuning voltage generating circuits 15(1), 15(2), . . . . 15(n) can be supplied from the input terminal of the constant voltage power supply circuit 5 or they can be supplied by rectifying the pulses across the load of the constant voltage power supply circuit 5 with the result that the receiver set can be reliably operated even when a battery is used as the power supply.

What is claimed is:

1. An electronic selector for selecting a desired channel and applying power to the load circuit of a receiver by operation of a single control comprising:
    a power supply circuit having input terminals for supplying power to said load circuit;
    a first switching circuit for on-off controlling said power supply circuit;
    a plurality of tuning voltage generating circuits;
    an electronic tuner for selecting channels in accordance with the voltage generated at the outputs of any of said tuning voltage generating circuits;
    a plurality of second switching circuits, one of said second switching circuits being connected to said first switching circuit and the remainder of said second switching circuits being connected to said plurality of tuning voltage generating circuits respectively, said second switching circuits controlling said first switching circuit and said tuning voltage generating circuits;
    a plurality of touch plates for selecting a desired channel and controlling said power supply circuit;
    a plurality of channel selection switching circuits, each of said channel selection switching circuits having a first input connected to one of said touch plates and a second input connected to the output of a corresponding second switching circuit, each of said channel selection switching circuits producing an output only when the corresponding second switching circuit is off and the connected plate is touched;
    a pulse generating circuit for generating pulse signals in response to the output from a channel selection switching circuit during the time said output is being produced by said channel selection switching circuit;
    a counter for counting the pulse signals from said pulse generating circuit and for producing a coded output signal, and
    a decoder having a plurality of output terminals each connected to a corresponding second switching circuit for producing an output signal at said output terminals corresponding to the coded output signal of said counter, wherein, by touching any of said touch plates, an output signal corresponding to the touched plate is provided by said decoder to the corresponding second switching circuit, said power supply circuit being turned off when the second switching circuit connected to said first switching circuit is on and said power supply circuit being turned on when a selected second switching circuit connected to any of said tuning voltage generating circuits is on, a channel corresponding to said selected second switching circuit being thereby selected.

2. An electronic channel selector according to claim 1, wherein the power for said pulse generating circuit, counter, decoder, first switching circuit, second switching circuits and tuning voltage generating circuits is supplied from the input terminals of said power supply circuit.

3. An electronic channel selector according to claim 1, wherein the power for said pulse generating circuit, counter and decoder is supplied from the input terminals of said power supply circuit, the power for said first switching circuit, second switching circuits and tuning voltage generating circuits is supplied through a rectifying circuit for rectifying pulses generated in said load circuit, and a unidirectional device is connected between an input terminal of said power supply circuit and an output terminal of said pulse rectifying circuit.

4. An electronic channel selector for selecting a desired channel and applying power to a load circuit comprising:
 a. a pair of input terminals for coupling to an external power source;
 b. a power supply circuit connected across said input terminals for supplying power to said load circuit;
 c. power switching means connected across said input terminals, said power switching means having an input, a first output and a second output coupled to said power supply circuit for controlling the supply of power to said load;
 d. a plurality of tuning voltage generators;
 e. an electronic tuner coupled to the outputs of said tuning voltage generators, said tuner selecting a channel corresponding to the output of a selected one of said tuning voltage generators;
 f. a plurality of switching circuits, each of said switching circuits being connected in series with a corresponding tuning voltage generator across said input terminals, and having an input and an output;
 g. a plurality of channel selection switching circuits each having a first input, a second input and an output, the second inputs of said channel selection switching circuits being connected to the outputs of corresponding switching circuits;
 h. a plurality of switching devices, each of said switching devices being connected to the first input of a corresponding channel selection switching circuit, and
 i. decoding means coupling the outputs of said channel selection switching circuits to the input of said power switching means and to the inputs of said plurality of switching circuits, said decoding means switching said power switching means to connect said load circuit to said power supply circuit and connecting the tuning voltage generator corresponding to the channel selection circuit coupled to the energized switching device to said electronic tuner thereby selecting the desired channel.

5. An electronic channel selector according to claim 4, wherein a further channel selection switching circuit is provided having its second input connected to the first output of said power switching means and a power switching device coupled to the first input thereof, energizing said power switching device switching said power switching means through said further channel selection switching circuit and said decoding means to disconnect said load circuit from said power supply circuit.

6. An electronic channel selector according to claim 4, wherein said decoding means comprises a pulse generating circuit coupled to the outputs of said channel selection switching circuits, a binary counter coupled to the output of said pulse generating circuit and a decoder interposed between the outputs of said binary counter and the inputs of said power switching means and said plurality of switching circuits.

7. An electronic channel selector according to claim 6, which further comprises a stabilized power supply circuit connected across said input terminals, the output of said stabilized power supply circuit being connected to said pulse generating circuit, said binary counter and said decoder.

8. An electronic channel selector according to claim 7, which further comprises a reference voltage source connected across said input terminals, the output of said reference voltage source being connected to said switching means, switching circuits and channel selection switching circuits.

* * * * *